US006838720B2

(12) United States Patent
Krieger et al.

(10) Patent No.: US 6,838,720 B2
(45) Date of Patent: Jan. 4, 2005

(54) MEMORY DEVICE WITH ACTIVE PASSIVE LAYERS

(75) Inventors: Juri H. Krieger, Brookline, MA (US); Nikolai Yudanov, Brookline, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/413,841

(22) Filed: Apr. 15, 2003

(65) Prior Publication Data

US 2004/0026714 A1 Feb. 12, 2004

Related U.S. Application Data

(63) Continuation-in-part of application No. 10/304,863, filed on Nov. 27, 2002, and a continuation-in-part of application No. 10/238,880, filed on Sep. 11, 2002, and a continuation-in-part of application No. PCT/RU01/00334, filed on Aug. 13, 2001.

(51) Int. Cl.$^7$ .................. H01L 27/108; H01L 31/119
(52) U.S. Cl. ......................... 257/296; 257/288
(58) Field of Search .................. 257/296, 288, 257/68, 306, 906, 908

(56) References Cited

U.S. PATENT DOCUMENTS

| | | | |
|---|---|---|---|
| 3,719,933 A | 3/1973 | Wakabayashi et al. |
| 3,810,127 A | 5/1974 | Hoff, Jr. |
| 4,267,558 A | 5/1981 | Guterman |
| 4,267,583 A | 5/1981 | Suzuki |
| 4,371,883 A | 2/1983 | Potember et al. |
| 4,616,340 A | 10/1986 | Hayashi et al. |
| 4,631,562 A | 12/1986 | Avery |
| 4,652,894 A | 3/1987 | Potember et al. |
| 4,677,742 A | 7/1987 | Johnson |
| 4,727,514 A | 2/1988 | Bhuva et al. |
| 4,733,375 A | 3/1988 | Terashima |

(List continued on next page.)

FOREIGN PATENT DOCUMENTS

| | | |
|---|---|---|
| DE | 196 40 239 A1 | 4/1998 |
| DE | 199 59 904 A1 | 6/2001 |
| EP | 0 268 370 A3 | 5/1988 |

(List continued on next page.)

OTHER PUBLICATIONS

*"A Disrupted Organic Film: Could Memories Be Made of This?," *ORNL Review*, vol. 33, No. 2, 2000.
*"Technical Summary of Programmable Metallization Cell Memory Technology," Version 1.3, Dec. 2001.
*"The 1998 Conference Archive," *The Sixth Foresight Conference on Molecular Nanotechnology*, Nov. 12–15, 1998, www.foresight.org/Conferences/MNT6/Index.html.
*Beck, A. et al., "Reproducible Switching Effect in Thin Oxide Films for Memory Applications," *Applied Physics Letters*, vol. 77, No. 1, pp. 139–141, Jul. 3, 2000.
*Bernard, Allen "A Big Name in Chips Helps Coatue in Molecular Memory Race," Aug. 27, 2000, www.nanoelectronicsplanet.com/features/article/0,4028,6571–1452831, 00.html.

(List continued on next page.)

*Primary Examiner*—David Nhu
(74) *Attorney, Agent, or Firm*—Amin & Turocy, LLP (57) ABSTRACT

A memory including memory cells having active and passive layers may store multiple information bits. The active layer may include an organic polymer that has a variable resistance based on the movement of charged species (ions or ions and electrons) between the passive layer and the active layer. The passive layer may be a super-ionic material that has high ion and electron mobility. The active layer may be self-assembled from a monomer in a liquid or gas.

20 Claims, 3 Drawing Sheets

U.S. PATENT DOCUMENTS

| | | |
|---|---|---|
| 4,834,911 A | 5/1989 | Carew |
| 4,839,700 A | 6/1989 | Ramesham et al. |
| 4,860,254 A | 8/1989 | Pott et al. |
| 5,012,445 A | 4/1991 | Kazuaki et al. |
| 5,034,192 A | 7/1991 | Wrighton et al. |
| 5,130,380 A | 7/1992 | Carew |
| 5,136,212 A | 8/1992 | Eguchi et al. |
| 5,153,681 A | 10/1992 | Kishimoto et al. |
| 5,196,912 A | 3/1993 | Matsumoto et al. |
| 5,206,525 A | 4/1993 | Yamamoto et al. |
| 5,245,543 A | 9/1993 | Smayling et al. |
| 5,296,716 A | 3/1994 | Ovshinsky et al. |
| 5,315,131 A | 5/1994 | Kishimoto et al. |
| 5,319,564 A | 6/1994 | Smayling et al. |
| 5,355,235 A | 10/1994 | Nishizawa et al. |
| 5,392,236 A | 2/1995 | Hashimoto |
| 5,412,614 A | 5/1995 | Bird |
| RE34,974 E | 6/1995 | Terashima |
| 5,431,883 A | 7/1995 | Barraud |
| 5,440,518 A | 8/1995 | Hazani |
| 5,563,081 A | 10/1996 | Ozawa |
| 5,572,472 A | 11/1996 | Kearney et al. |
| 5,579,199 A | 11/1996 | Kawamura et al. |
| 5,670,818 A | 9/1997 | Forouhi et al. |
| 5,691,935 A | 11/1997 | Douglass |
| 5,698,874 A | 12/1997 | Hayashi |
| 5,734,605 A | 3/1998 | Zhu et al. |
| 5,761,115 A | 6/1998 | Kozicki et al. |
| 5,761,116 A * | 6/1998 | Li et al. ............... 365/185.1 |
| 5,770,885 A | 6/1998 | McCollum et al. |
| 5,818,749 A | 10/1998 | Harshfield |
| 5,849,403 A | 12/1998 | Aoki et al. |
| 5,869,882 A | 2/1999 | Chen et al. |
| 5,896,312 A | 4/1999 | Kozicki et al. |
| 5,900,662 A | 5/1999 | Frisina et al. |
| 5,914,893 A | 6/1999 | Kozicki et al. |
| 6,055,180 A * | 4/2000 | Gudesen et al. ............ 365/175 |
| 6,060,338 A | 5/2000 | Tanaka et al. |
| 6,064,589 A | 5/2000 | Walker |
| 6,088,319 A | 7/2000 | Gudesen |
| 6,118,684 A | 9/2000 | Yihong et al. |
| 6,128,214 A | 10/2000 | Kuekes et al. |
| 6,150,705 A | 11/2000 | Chen |
| 6,288,697 B1 | 9/2001 | Eto et al. |
| 6,292,396 B1 | 9/2001 | Tailliet |
| 6,326,936 B1 | 12/2001 | Inganas et al. |
| 6,349,054 B1 | 2/2002 | Hidaka |
| 6,353,559 B2 | 3/2002 | Hasegawa et al. |
| 6,384,427 B1 | 5/2002 | Yamazaki et al. |
| 6,388,293 B1 * | 5/2002 | Ogura et al. ............... 257/365 |
| 6,403,396 B1 | 6/2002 | Gudesen et al. |
| 6,403,397 B1 | 6/2002 | Katz |
| 6,407,953 B1 | 6/2002 | Cleeves |
| 6,418,049 B1 | 7/2002 | Kozicki et al. |
| 6,424,553 B2 | 7/2002 | Berggren et al. |
| 6,426,891 B1 | 7/2002 | Katori |
| 6,429,457 B1 | 8/2002 | Berggren et al. |
| 6,432,739 B1 | 8/2002 | Gudesen et al. |
| 6,449,184 B2 | 9/2002 | Kato et al. |
| 6,459,095 B1 | 10/2002 | Heath et al. |
| 6,461,916 B1 | 10/2002 | Adachi et al. |
| 6,487,106 B1 | 11/2002 | Kozicki et al. |
| 6,627,944 B2 * | 9/2003 | Mandell et al. ............ 257/315 |
| 2001/0014038 A1 | 8/2001 | Hasegawa et al. |
| 2001/0054709 A1 | 12/2001 | Heath et al. |
| 2001/0055384 A1 | 12/2001 | Yamazaki et al. |
| 2002/0027819 A1 | 3/2002 | Tomanek et al. |
| 2002/0101763 A1 | 8/2002 | Hosogane et al. |
| 2002/0104889 A1 | 8/2002 | Forrest et al. |
| 2002/0125504 A1 | 9/2002 | Perlov et al. |
| 2002/0134979 A1 | 9/2002 | Yamazaki et al. |
| 2002/0163030 A1 | 11/2002 | Mandell et al. |
| 2002/0163057 A1 | 11/2002 | Bulovic et al. |
| 2002/0163828 A1 | 11/2002 | Krieger et al. |
| 2002/0163829 A1 | 11/2002 | Bulovic et al. |
| 2002/0163830 A1 | 11/2002 | Bulovic et al. |
| 2002/0163831 A1 | 11/2002 | Krieger et al. |
| 2002/0168820 A1 | 11/2002 | Kozicki et al. |

FOREIGN PATENT DOCUMENTS

| | | |
|---|---|---|
| EP | 0 385 688 A2 | 9/1990 |
| EP | 0 727 822 A2 | 8/1996 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

*Chen, J. et al., "Room-temperature Negative Differential Resistance in Nanoscale Molecular Junctions," *Applied Physics Letters*, vol. 77, No. 8, Aug. 21, 2000.

*Collier, C. P. et al., "Electrically Configurable Molecular-Based Logic Gates," *Science*, vol. 285, pp. 391–394, Jul. 16, 1999.

*Gannon, Andrew, "Toward the Next Generation CD," *Physical Review Focus*, Feb. 16, 2000.

*Gao, H. .J. et al., "Reversible, Nanometer-Scale Conductance Transitions in an Organic Complex," *Physical Review Letters*, vol. 84, No. 8, pp. 1780–1783, Feb. 21, 2000.

*Gao, H. .J. et al., "Using a New Kind of Organic Complex System of Electrical Bistability for Ultrahigh Density Data Storage," J. Vac. Sci. Technol. B vol. 15, No. 4, pp. 1581–1583, Jul./ Aug. 1997.

*International Search Report, PCT/RU01/00334, search completed Feb. 14, 2002.

*International Search Report, PCT/US02/14236, search completed Aug. 14, 2002.

*International Search Report, PCT/US02/14237, search completed Sep. 9, 2002.

*International Search Report, PCT/US02/14238, search completed Aug. 9, 2002.

*International Search Report, PCT/US02/14239, searc completed Aug. 20, 2002.

*International Search Report, PCT/US02/14269, search completed Mar. 27, 2003.

*International Search Report, PCT/US02/14270, search completed Mar. 28, 2003.

*Japanese patent abstract of publication No. 01–103137, Apr. 20,1 989.

*Japanese patent abstract of publication No. 01278781, Nov. 9, 1989.

*Japanese patent abstract of publication No. 61107723, May 26, 1986.

*Japanese patent abstract of publication No. 63293729, Nov. 30, 1998.

*Krieger, Ju. H. et al., "Molecular Analogue Memory Cell Based on Electrical Switching and Memory in Molecular Thin Films", *Synthetic Metals*, 7730 (2000), pp. 1–4.

*Krieger, Juri H. et al., "Molecular Analogue Memory Cell," *Sixth Foresight Conference on Molecular *Nanotechnology*, Santa Clara, California, Nov. 12–15, 1998.

*Krieger, Yu. G. et al., "Study of Test Structures of a Molecular Memory Element," *Institute of Inorganic Chemistry*, Siberian Branch, Russian Academy of Sciences. Translated from *Zhumal Strukturnoi Khimii*, vol. 34, No. 6, pp. 152–156, Nov.–Dec. 1993. Original article submitted Apr. 27, 1993.

*Krieger, Yu, G., "Molecular Electronics: Current State and Future Trends," *Journal of Structural Chemistry*, vol. 34, No. 6, pp. 896–904, Nov.–Dec. 1993.

*Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

*Kurita, Ryo et al., "Field Modulation Effects on Charge–Density–Wave Conduction in NbSe$_3$," *Physica B*, 284–288 (2000), pp. 1161–1662.

*Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850–852. Aug. 10, 1998.

*Ma, L.P. et al., "Nanometer–Scale Recording on an Organic Complex Thin Film With a Scanning Tunneling Microscope," *Applied Physics Letters*, vol. 69, No. 24, pp. 3752–3753, Dec. 9, 1996.

*Machida, Yasuhiko et al., "Electrical Switching in Evaporated Lead Phthalocyanine Films," *Japanese Journal of Applied Physics*, vol. 28, No. 2, pp. 297–298, Feb. 1989.

*Ovshinsky, Stanford R., "Localized States in the Gap of Amorphous Semiconductors," *Physical Review Letters*, vol. 36, No. 24, pp. 1469–1472, Jun. 14, 1976.

*Potember, R. S. et al., "Electrical Switching and Memory Phenomena in Cu–TCNQ Thin Films," *Applied Physics Letters*, vol. 34, No. 6, pp. 405–407, Mar. 15, 1979.

*Reed, M.A. et al., "Molecular Random Access Memory Cell," *Applied Physics Letters*, vol. 78, No. 23, pp. 3735–3737, Jun. 4, 2001.

*Rossel, C. et al., "Electrical Current Distribution Across a Metal–Insulator–Metal Structure During Bistable Switching," Apr. 24, 2001.

*Rotman, David, "Molecular Memory," *Technology Review*, May 2001.

*Semiconductor Times*, pp. 5–6, Jul. 2002.

*Stikeman, Alexandra, "Polymer Memory: The Plastic Path to Better Data Storage," *Technology Review*, p. 31, Sep. 2002.

*Zhou, C. et al., "Nanoscale Metal/Self–Assembled Monolayer/Metal Heterostructures," *Applied Physics Letters*, vol. 71, No. 5, pp. 611–613, Aug. 4, 1997.

* cited by examiner

MEMORY DEVICE WITH ACTIVE PASSIVE LAYERS

This application is a continuation-in-part of PCT application PCT/RU01/00334, filed Aug. 13, 2001 and is a continuation-in-part of application Ser. No. 10/238,880, filed Sep. 11, 2002 and is a continuation-in-part of application Ser. No. 10/304,863, filed Nov. 27, 2002. All of PCT/RU01/00334, application Ser. No. 10/238,880, and application Ser. No. 10/304,863 are hereby incorporated by reference in their entirety.

FIELD OF THE INVENTION

The invention relates to memory devices, e.g., for electronic computers, associative memory systems, circuit elements with programmable resistance for creating synapses for neuronal nets, direct access data banks, and video and/or audio equipment.

BACKGROUND

Modern electronic computers employ several different types of memory devices for various purposes and functions requiring different performance/operating characteristics, e.g., read/write and storage/retrieval speeds. The multiplicity of different requirements for the various memory devices substantially complicates the operation of computer systems, increases start-up times, and complicates data storage.

As a consequence of the above-mentioned drawbacks and disadvantages associated with current memory device technology, a high priority task of the microelectronics industry is creation/development of a universal memory device/system having high read/write speeds, high storage density, and long tern data retention characteristics.

A number of electronic memory or switching devices have been proposed or developed which include a bi-stable element that can be controllably alternated between high impedance and low impedance states by application of an electrical input, e.g., a voltage equal to or greater than a threshold voltage. Memory and switching devices utilizing such threshold-type behavior have been demonstrated with both organic and inorganic thin film semiconductor materials, including amorphous silicon, chalcogenides such as arsenic trisulphide-silver ($As_2S_3$—Ag), organic materials, and heterostructures such as $SrZrO_3$(0.2% Cr)/$SrRuO_3$. See, for example: U.S. Pat. Nos. 5,761,115; 5,896,312; 5,914,893; 5,670,818; 5,770,885; and 6,150,705; Russian Patent No. 2,071,126; S. R. Ovshinsky, *Phys. Rev. Lett.*, 36, 1469 (1976); J. H. Krieger, et al.,*J. Struct. Chem.*, 34, 966 (1993); J. H. Krieger, et al., *Synthetic Metals*, 122, 199 (2001); R. S. Potember, et al., *Appl. Phys. Lett.*, 34 (6), 405 (1979); Y. Machida, et al., *Jap. J. Appl. Phys.*, Part 1, 28 (2), 297 (1989); and A. Beck, et al.,*Appl. Phys. Lett.*, 77, 139 (2000).

The inventors have appreciated a need for memory devices which are free of the shortcomings, drawbacks, and disadvantages associated with memory devices of the conventional art. The present invention, therefore, has as an aim the development of a universal memory device/system for high speed data storage and retrieval, with capability of long term storage at high bit densities.

SUMMARY OF INVENTION

In one aspect of the invention, an improved memory storage and retrieval device is provided. The memory provided in accordance with aspects of the invention may be used in any suitable type of computer memory, such as RAM, SRAM, DRAM, flash memory, etc.

In another aspect of the invention, an improved memory storage and retrieval device having very high read and write speeds, long term data retention, and high data storage density is provided.

In one aspect of the invention, a memory cell includes a pair of electrodes and an active layer and a passive layer between the electrodes. The active layer may store information by the reversible introduction and removal of charged species. The passive layer may be a source material for reversibly donating the charged species to and accepting the charged species from the active layer.

In one illustrative embodiment, a reversibly programmable memory includes at least one memory cell. The at least one memory cell may include a first conductive electrode layer, and a passive layer formed over the first electrode layer. The passive layer may be a super-ionic material adapted to reversibly donate and accept charged species, i.e., ions or ions and electrons. An active layer may be formed over the passive layer, and may include an organic polymer that has a reversibly variable electrical conductivity upon the introduction and removal of charged species from the passive layer. The electrical conductivity of the organic polymer may be variable between three or more states to store multiple information bits, and the organic polymer may have a relatively lower electrical conductivity when free of charged species and a relatively higher electrical conductivity when charged species are introduced. A second conductive electrode layer may be formed over the active layer so that the passive layer reversibly donates and accepts charged species to and from the active layer when an electrical potential difference is applied between the two electrode layers. The two electrode layers may be used to both program the memory cell to store information and read stored information from the memory cell.

In another illustrative embodiment, a method for forming a memory having a plurality of reversibly programmable memory cells includes forming a plurality of first electrodes on a substrate, and forming a passive layer including a super-ionic material on each of the plurality of first electrodes. A polymer layer may be selectively formed only over the passive layer on each of the plurality of first electrodes to form an active layer thereon by exposing the passive layer to a gas such that material in the gas self-assembles only on the passive layer on each of the plurality of first electrodes to form the polymer layer. The polymer may have a reversibly variable electrical conductivity upon the introduction and removal of charged species from the passive layer. A plurality of second electrodes may be formed over the active layer to produce the memory cell.

In one aspect of the invention, the passive layer includes copper sulfide.

In one aspect of the invention, the first conductive electrode layer is made of copper.

In one aspect of the invention, the active layer includes one of polyphenylacetylene (PPA) and polydiphenylacetylene (PDPA).

In one aspect of the invention, the memory cell includes a barrier layer that impedes spontaneous movement of charged species between the active layer and the passive layer when an electrical potential difference is not applied between the two electrode layers. The barrier layer may be positioned between the active layer and the passive layer.

In one aspect of the invention, the memory cell includes only one active layer and only one passive layer between the first and second conductive electrode layers.

Additional advantages and aspects of the present invention will become readily apparent to those skilled in the art from the following description, wherein embodiments of the present invention are shown and described. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which similar reference numerals are employed throughout to designate similar features, and in which the various features are not necessarily drawn to scale but rather are drawn as to best illustrate the pertinent features, wherein.

DETAILED DESCRIPTION

Various aspects of the invention are described below with reference to illustrative embodiments. However, it should be understood that the invention is not limited to those embodiments described below, but instead may be used in any suitable system or arrangement. For example, aspects of the invention are described below in connection with a non-volatile memory that stores information based on a resistance value. However, aspects of the invention may be used with other memory types, such volatile memories, and/or memories that store information in other ways, such as in a capacitance value, as a stored charge, or other property.

As discussed above, in one aspect of the invention, a rewritable memory includes a memory cell with an active layer having an organic polymer material and a passive layer having a superionic material. The superionic material may donate and accept charged species, i.e., ions or ions and electrons, with respect to the active layer to change the electrical conductivity of the organic polymer. A pair of electrical connections, e.g., addressable electrodes, may be used to communicate with the memory cell to store and read information from the memory cell. The memory cell may store information, such as binary information or multi-bit information, in any suitable way, such as in the form of a resistance value. For example, if the memory cell stores binary information ("0" or "1" values), a high resistance may represent a "0" while a low resistance may represent a "1". If the memory cell stores multi-bit information, different resistance levels may represent different values. For example, the memory cell may store a two-bit word where a high resistance may represent a "00" value, a lower resistance may represent a "01" value, a somewhat lower resistance may represent a "10" value, and a lowest resistance may represent a "11" value. Of course, it will be appreciated that the memory cell may store any number of discrete information values, not necessarily numbers of discrete information values that are powers of 2 (e.g., 3, 5, 7 . . . values). Further, in some aspects of the invention, the stored information may be read as a property other than a resistance, such as a capacitance, a voltage level, a particle spin orientation, an orientation of a magnetic dipole or other element, and so on.

In one aspect of the invention, only two electrodes may be used to both program and read the memory cell. This is in contrast to other memory cell architectures in which a first pair of electrodes are used to program a cell, and a second pair of electrodes are used to read the cell. Using only two electrodes to both program and read a memory cell may simplify the construction of the memory cell and simplify the circuitry needed to control operation of a memory.

Suitable electrically conductive materials for use as electrodes include metals, metal alloys, metal nitrides, oxides, sulfides, carbon, and polymers, including for example: aluminum (Al), silver (Ag), copper (Cu), titanium (Ti), tungsten (W), their alloys and nitrides, amorphous carbon, transparent oxides, transparent sulfides, and organic polymers. The work functions of the particular materials utilized for the electrodes determines the ease with which electrons and/or holes may be injected into the device under the influence of the applied electric field, and in turn, may affect the memory function of the device, i.e., the speed at which the device can be programmed, read, and erased, as well as the amount of electrical power required to perform these functions. In addition, one of the electrodes may, in some instances, serve as a reactant material for forming the passive layer of the device. For example, as discussed in more detail below, a layer of copper on an electrode may be reacted with a suitable material, such as a hydrogen sulfide gas, to form a passive layer of copper sulfide.

In one aspect of the invention, charged species (ions or ions and electrons) may move from the passive layer into the active layer to dope the organic polymer with charged species and/or to form nanowire features in the polymer. The doping or nanowire formation may serve to store information in the memory cell by changing the electrical resistance of the polymer. Movement of the charged species may be controlled by the application of appropriate electric fields across the memory cell via its electrodes. An electric field of a certain suitable magnitude, polarity and/or duration may cause the charged species to move from the passive layer into the active layer, or vice versa.

The organic polymer used in the active layer may be any one of a number of different suitable materials, such as a conjugated polymer. For example, the active layer may include an organic polymer with relatively low intrinsic electrical conductivity, and can be formed into layers that exhibit a substantial increase in conductivity (i.e., conductivity modulation) when doped with charged species, i.e., ions or a combination of ions and electrons, which are introduced thereinto under the influence of an applied electrical field. Examples of polymers with variable electrical conductivity include conjugated polymers characterized by conjugated unsaturated bonds which facilitate electron movement. Suitable polyacetylene polymers include the following: polydiphenylacetylene, poly(tbutyl) diphenylacetylene, poly(trifluoromethyl)diphenylacetylene, polybis(trifluoromethyl)acetylene, polybis(t-butyldiphenyl) acetylene, poly(trimethylsilyl) diphenylacetylene, poly (carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl) phenylacetylene, poly(trimethylsilyl) phenylacetylene, and derivatives of the foregoing with ion trapping molecular groups selected from the group consisting of crown ethers, cyclic analogues of crown ethers, carboxyls, diimines, sulfonics, phosphonics and carbodithioics. Other suitable polymers include polyaniline, polythiophene, polypyrrole, polysilane, polystyrene, polyfuran, polyindole, polyazulene, polyphenylene, polypyridine, polybipyridine, polyphthalocyanine, poly (ethylenedioxythiophene) and derivatives of the foregoing with ion trapping molecular groups selected from the group consisting of crown ethers, cyclic analogues of crown ethers, carboxyls, diimines, sulfonics, phosphonics and carbodithioics. Preferred polymers are those with high thermal stability, e.g., thermally stable at about 400° C. and higher.

In one aspect of the invention, a passive layer is used as a source of the charged species, i.e., ions or ions and electrons, which are introduced into the active layer during application of the first polarity electrical field, and as an acceptor (sink) of the charged species which are removed (withdrawn) from the active layer during application of a second, opposite polarity electrical field. According to the invention, reversible charged species donor/acceptor materials suitable for use as the passive layer include, for example, compounds with mobile ions, including superionic conductors and intercalation compounds, e.g., $AgI$, $AgBr$, $Ag_2S$, $Ag_2Se$, $Ag_{2-x}Te$, $RbAg_4I_5$, $CuI$, $CuBr$, $Cu_{2-x}S$, $Cu_{2-x}Se$, $Cu_{2-x}Te$, $Ag_xCu_{2-x}S$, $Cu_3HgI_4$, $Cu_3HgI_4$, $AuI$, $Na_xCu_ySe_2$, $LiNiO_2$, $Li_xTiS_2$, $Li_xMoSe_2$, $Li_xTaS_2$, $Li_xVSe_2$, $Li_xHfSe_2$, $Li_xWO_3$, $Cu_xWO_3$, $Na_xWO_3$, $Na\beta\text{-}Al_2O_3$, $ZrO_{2-x}$, $CeO_{2-x}$, $CaF_2$, and $BaF_2$, which materials reversibly donate/accept silver (Ag), copper (Cu), gold (Au), lithium (Li), sodium (Na), other metal or metal-containing ions, oxygen (O), fluorine (F), and other halogen-containing ions. In one illustrative embodiment copper sulfide ($Cu_{2-x}S$) has been found to be a particularly effective superioninc material for use in a passive layer.

Materials usable as the passive layer are characterized by the rapidity with which they donate and accept charged species under the influence of a relatively weak electric field, i.e., within the range of electric fields used in typical semiconductor devices such as flash memories. Super-ionic materials are materials that have a high ion and electron mobility, and so these materials can donate and accept ions at a very rapid rate. Thus, application of a first polarity electric field to a layer stack comprised of at least one active layer and at least one passive layer will draw charged species from the latter into the former, and application of a second, opposite polarity electric field will "pull" at least some of the ions out of the former layer and return them to the latter layer. Further, the donation and acceptance of the charged species is reversible and can be modulated for extremely long time periods and for millions of cycles.

According to the invention, the performance of memory cells or devices may be a function of the conductivity modulation characteristics of the material(s) in the active layer. Thus, the ease with which charged species such as ions are reversibly donated to the active layer and withdrawn therefrom may determine the ease with which "programming" and "erasing" of the memory device occurs. Since this feature necessitates facile movement of the charged species into and out from the active layer, the charged species will typically travel freely in the material, and thus have a tendency to return to their initial state or location under the influence of internal electrical fields (as during absence of the externally applied electrical field).

Therefore, in one aspect of the invention, in order to improve the data retention characteristics of the memory devices, the interval during which relaxation occurs may be controlled, i.e., the interval when previously injected mobile ions are partially caused to move out of the active layer and return to the passive layer may be controlled. Such control may, for example, be achieved by providing at least one barrier layer for impeding motion of the charged species in the absence of an applied electrical field. A barrier layer, therefore typically has the property of impeding travel of charged species, or a property of not attracting, or even repelling, charged species. Thus, the barrier layer may limit spontaneous movement of the charged species (i.e., movement in the absence of an externally applied electric field) between the active layer and the passive layer, thereby increasing the data retention time of the memory device. Suitable materials for use as the barrier layer according to the invention include $Li_3N$ and $LiAlF_4$.

Figure 1:
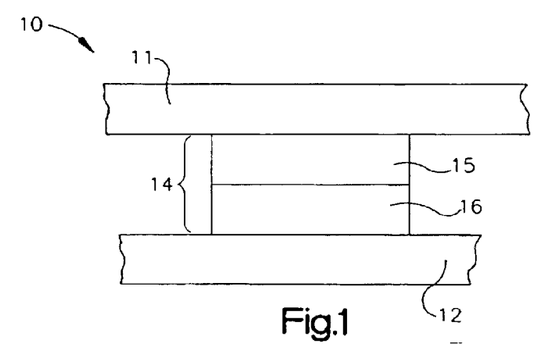
FIG. 1 shows a schematic view of a two-layer memory cell in accordance with the invention.

FIG. 1 shows a schematic view of a memory cell 10 that incorporates various aspects of the invention discussed above. The memory cell 10 includes an upper electrode 11 and a lower electrode 12 with a layer stack interposed therebetween. The layer stack forms a memory element 14 having an upper, active layer 15 in contact with upper electrode 11 and a lower, passive layer 16 in contact with lower electrode 12. The passive layer 16 is a source (i.e., donor) and acceptor of a charged species, illustratively positively charged ions (typically metal ions) and the active layer 15 is a relatively high resistance material (e.g., an insulator) including a plurality of micro-channels or pores extending generally vertically between the passive layer 16 and the upper electrode 11 for facilitating injection and transport of ions in the active layer 15.

In this illustrative embodiment, the first and second electrically conductive electrodes 11 and 12 are made of copper, although the electrodes 11 and 12 may be made of any suitable material, such as those listed above. The electrodes 11 and 12 may be made from about 3,000 to about 8,000 Angstroms thick. The active layer 15 includes polyphenylacetylene (PPA) but may include any suitable material as discussed above. The active layer 15 may be made from about 50 to about 1,000 Angstroms thick, with 100 Angstroms presently preferred. The passive layer 16 includes copper sulfide, but may include other super-ionic materials. The passive layer 16 may be made from about 20 to about 100 Angstroms thick, with 50 Angstroms presently preferred. Of course, the thicknesses and materials used in the portions of the memory cell 10 may be varied in any suitable way. If provided, a barrier layer positioned between the active and passive layers may be made barrier layer 4 from about 20 to about 300 Angstroms thick, with 50 Angstroms presently preferred.

When the memory cell 10 is in a high resistance, low conductivity state, charged species are generally confined to the passive layer 16 and the micro-channels or pores formed by the polymer in the active layer 15 are substantially devoid of charged species. When the memory cell 10 is in a low resistance, high conductivity state, ions from the passive layer 16 are donated into the micro-channels or pores of the active layer 15 to form electrically conductive "nano-wires" or to otherwise dope the active layer 15, e.g., after application of a suitable electric field. (In this regard, it should be noted that some ions may be present within micro-channels or pores when memory cell 10 is in a low conductivity state; however, the amount of ions may be insufficient to sufficiently establish electrically conductive "nano-wires" to substantially change the resistance of the active layer 15). Communication with only the electrodes 11 and 12 may be sufficient to both program and read the memory element 14. That is, an electrical signal applied to the electrodes 11 and 12 may be used to cause charged species movement in the memory cell 10 to program the cell and used to read information stored by the cell, e.g., in the form of a resistance.

Figure 2:
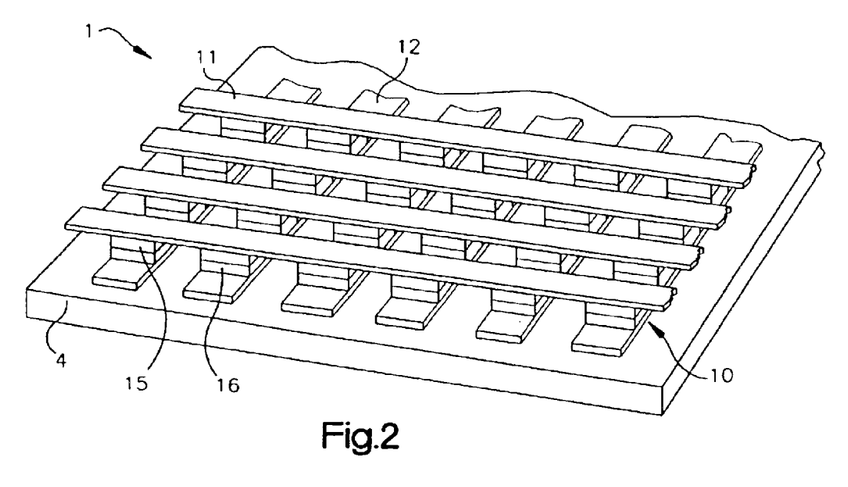
FIG. 2 shows a schematic perspective view of a memory including a plurality of memory cells in accordance with the invention.

FIG. 2 shows a memory 1 having a plurality of memory cells 10 formed on a substrate 4. The substrate 4 may be any suitable material, such as silicon, a polymer film or other. In this illustrative embodiment, the electrodes 12 are formed on the substrate 3 as metal strips or lines, but could be formed in other ways, e.g., each electrode formed as an individual pad. The passive layer 16 of each cell 10 is formed on the electrodes 12, with the active layer 15 on top of the passive layer 16 and the electrodes 11 formed as metal strips or lines over the active layers 15. In this embodiment, the strips that form the electrodes 11 are formed at right angles to the strips that form the electrodes 12, but any suitable angle may be used. Although the memory 1 is shown in FIG. 2 as a two dimensional (2D) array of memory cells 10, the memory 1 may have a three dimensional (3D) structure with memory cells 10 formed on top of other memory cells 10. For example, in 3D arrays, memory cells 10 may be arranged in 2D layers that are stacked one on each other. Although no material is shown in the spaces between memory cells 10, an insulating material may be provided as will be understood by those of skill in the art. Individual cells 10 may be addressed using a matrix addressing scheme, e.g., by applying suitable electrical signals to the strips that form the electrodes 11 and 12. Alternately, each memory cell 10 may be associated with a transistor or other switch to allow individual addressing of memory cells 10.

Figure 3:
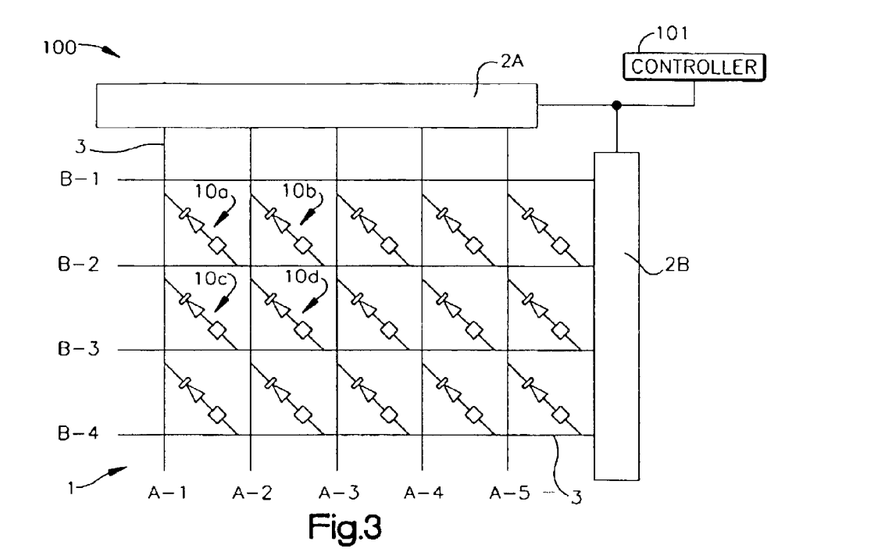
FIG. 3 shows a schematic diagram of a memory and associated control circuitry in accordance with the invention.

FIG. 3 shows a schematic block diagram of a data processing system 100 that includes a memory 1 in accordance with at least one aspect of the invention. In this illustrative embodiment, the system 100 includes a controller 101, which may include any suitable microprocessor or other data processing device, and may program the memory 1 to store information and read stored information from the memory 1. In this illustrative embodiment, the memory cells 10 are addressed by a controller 101 via addressing circuits 2A and 2B and addressing lines 3. As is well known in the art, the addressing circuits 2A and 2B may allow the controller 101 to send and receive signals to specific memory cells 10 or groups of memory cells 10. A diode as shown in FIG. 3, a transistor switch or other device included for each memory cell 10 may allow for individual addressing of the memory cells 10.

In accordance with one aspect of the invention, the memory 1 may be controlled to store information, i.e., programmed, based on a signal that applies a reverse bias voltage to a diode associated with the cell. The diode may be configured to normally have a very high resistance to a reverse bias voltage, but exhibit a low resistance to reverse bias voltages that exceed the diode's breakdown voltage. Thus, the controller 101 may apply a reverse bias voltage across the memory cell 10 that exceeds the diode's breakdown voltage to cause an electric field to be created between, or a current to pass between, the first electrode 11 and the second electrode 12 of the memory cell. The electric field or current may cause the memory cell 10 to change state, and therefore store information. In turn, memory cells 10 may be read using a forward bias voltage applied across the diode. As memory cell addressing schemes are well known to those in the art, additional details regarding the various ways in which memory cells in accordance with the invention are not provided.

In one aspect of the invention, a memory cell 10 may be programmed in two or more states. For example, an electric field and/or current applied to the memory cell 10 may cause charged species movement in the memory cell 10 such that the resistance of the active layer 15 is changed. The duration that the field is present and/or the current passes through the memory cell 10 may determine the information stored by the memory cell 10. For example, current passing through the memory cell 10 for a first amount of time may cause the memory cell 10 to store a first value, while current passing for a second, longer amount of time may cause the memory cell 10 to store a second value. In another embodiment, different voltage levels may cause the memory cell 10 to store different information. Multi-bit or multi-state programming in which a memory cell 10 is capable of storing three or more different values may be used. For example, a memory cell 10 may be programmed between two or more different resistance states where each discrete resistance state represents a different stored value.

Data retention characteristics of the memory cell, i.e., the ability of the memory cell to maintain a programmed condition, may be controlled based on the mobility of charged particles in the active and/or passive layers. Such control may, for example, be achieved by providing appropriately selecting materials for the active and/or passive layers, or in some embodiments, providing at least one barrier layer for impeding motion of the charged particles in the absence of an applied electrical field. The arrangement of the active/passive layers and or the barrier layer may limit spontaneous movement of the charged particles (i.e., movement in the absence of an externally applied electric field) between the active layer and the passive layer, thereby increasing the data retention time of the memory device.

Figure 4:
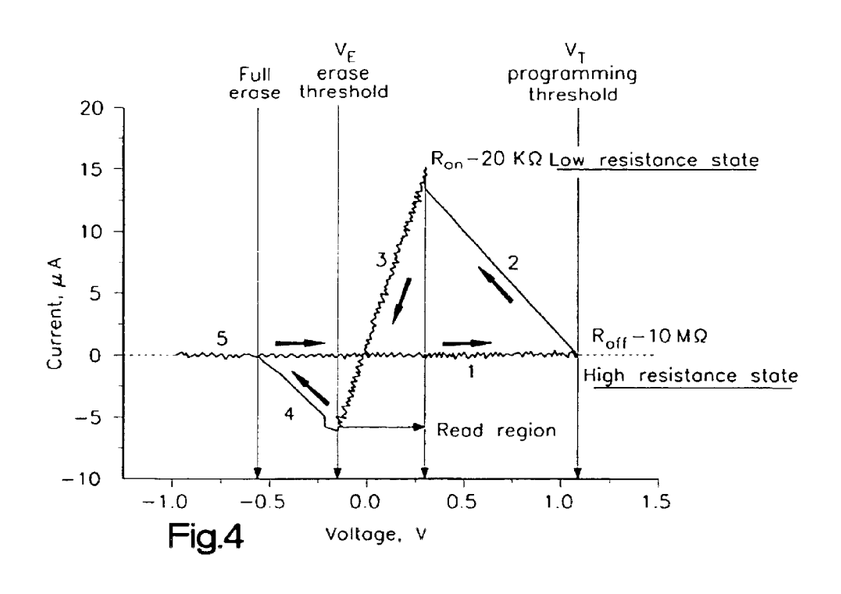
FIG. 4 is a current (I)-voltage (V) plot for illustrating operation of memory devices according to the invention.

FIG. 4 shows a current (I)-voltage (V) plot for illustrating operation of a memory cell in accordance with the invention. Starting at the origin of the plot (i.e., V and I=0), the voltage (V) applied to a device in the "off" (insulating, high resistance, or low conductivity) state is initially increased along curve 1. When the applied voltage reaches the programming threshold voltage $V_T$, typically in the range 0.5–4 V, the device may begin to switch from a high resistance "off" state to a lower resistance "on" state (e.g., logical value "1") along curve 2. During programming along curve 2, charged species from the passive layer may be mobilized by the applied electric field, introduced into the active layer, and arranged into conductive micro-channels or other suitable arrangements. The decrease in resistance of the memory cell may correspond to the formation of the electrically conductive nano-wires or other features, thereby storing information in the cell in the form of a resistance. Multi-bit programming may be achieved by varying the extent to which charged species are introduced into the active layer. For example, stopping programming at different points along the curve 2 may provide the memory cell with different resistance values. If these different resistance values can be distinguished when reading the memory cell, they may be exploited to provide the memory cell with a multi-bit programming capability.

The memory can be read at any voltage below the threshold voltage $V_T$, i.e., the "read region". Thus, a low voltage may be used to probe the device and check its resistance. A low current may indicate the device is in the high resistance, "off" state, and a high current may indicate the device is in a lower resistance, "on" state. The "read" operation may be non-destructive and not disturb the programmed state of the device.

From the lowest resistance state at the intersection between curves 2 and 3, the applied voltage may be reduced towards 0 V along curve 3. The slope of the I-V curve indicates the memory is in a low resistance state, since the steeper the slope of the I-V curve, the lower the resistance. The difference between the "on" and "off" states is termed the "on/off ratio", which may be as high as 9 orders of magnitude for the inventive devices, i.e., from several M ohms to ~100–200 ohms, but typically is ~4–6 orders of magnitude.

With the device in a low resistance "on" state, erase may be performed by applying an increasingly negative voltage (along curve 3) until the erase threshold voltage $V_E$ is reached, at which point the device switches back to the high resistance "off" state along curve 4. Therefore, "erasing" may put the memory cell in a state that represents a stored value, e.g., a logical 0. Alternately, erasing may merely ready the memory cell for programming to store information values. Erase threshold voltages $V_E$ are typically in the same range as programming threshold voltages $V_T$, but can be tuned depending upon the choice of materials for the active and passive layers, electrodes, and layer thicknesses. In conceptual terms, an erase operation corresponds to the removal of a minimum amount of charged species sufficient to adjust the resistance of the cell. As a consequence, only a small number of particles may need to be removed from the active layer to effectively change the resistance.

Switching of the memory between a high resistance "off" state (corresponding to a logical 0) and a lower resistance "on" state (corresponding to a logical 1) may occur quickly, i.e., on the order of about 100 nsec., indicating high operational speed during programming.

Figure 5:
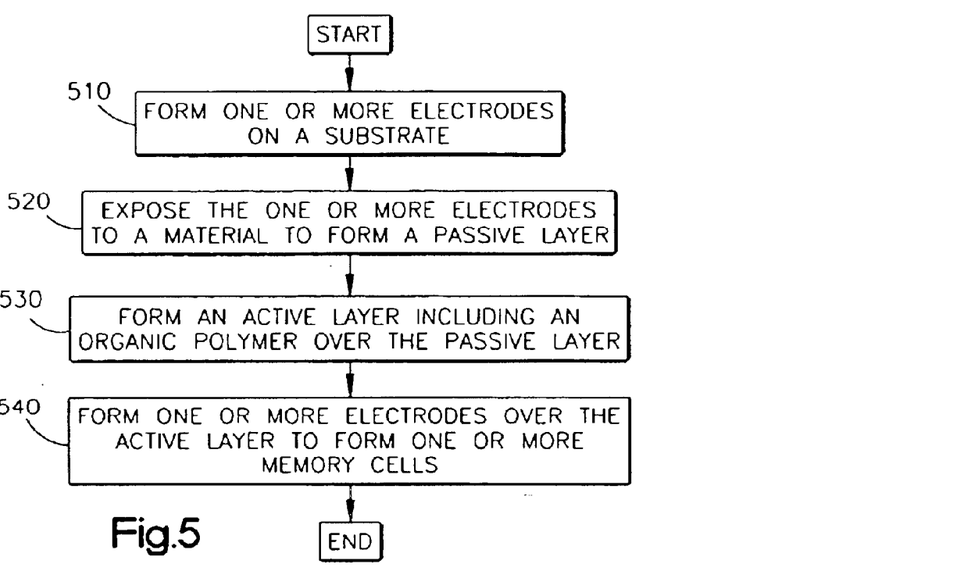
FIG. 5 is a flow chart of steps in a method for forming a memory cell in which a passive layer is formed by reacting a surface of an electrode with a material.

In accordance with the invention, the various layers in a memory cell 10 may be formed in any suitable way. In one aspect of the invention, the passive layer in a memory cell may be formed by reacting an electrode layer with a suitable material instead of actually placing a material on the electrode layer. For example, FIG. 5 shows steps in a method for forming one or more memory cells. In step S10, one or more electrodes are formed on a substrate. For example, one or more layers of copper or other suitable material may be deposited on an insulating substrate by conventional thin film deposition techniques such as thermal evaporation, sputtering, e-beam evaporation, etc. The copper or other material may be deposited in any suitable arrangement, such as individual pads, strips or other shapes, to any suitable thickness, such as 100 to 400 Angstroms.

In step S20, the one or more electrodes are exposed to a material to form a passive layer on the electrode(s). For example, the copper electrodes may be exposed to an admixture gas of nitrogen having 2% hydrogen sulfide ($H_2S$) in a chamber at 80 degrees Celsius for approximately 30 minutes. Exposing the copper layer to the $H_2S$ gas causes a copper sulfide ($Cu_{2-x}S$) layer to form on the copper electrode (s). As is described above, $Cu_{2-x}S$ is a super-ionic material that readily donates and accepts charged species, and thus forms a passive layer over the copper electrode(s).

In step S30, an active layer including an organic polymer may be formed over the passive layer. The organic polymer may be deposited using well-known thin film deposition techniques, such as thermal evaporation, spin coating, CVD, etc. As described in more detail below, an organic polymer layer may be self-assembled on the passive layer by exposing the passive layer to a monomer gas. Any suitable polymer, such as those listed above, may be used to form the active layer.

In step S40, one or more electrodes are formed over the active layer(s) to form one or more memory cells. As with the electrode(s) formed in step S10, the electrodes formed over the active layer may be formed using any suitable process and using any suitable material.

Figure 6:
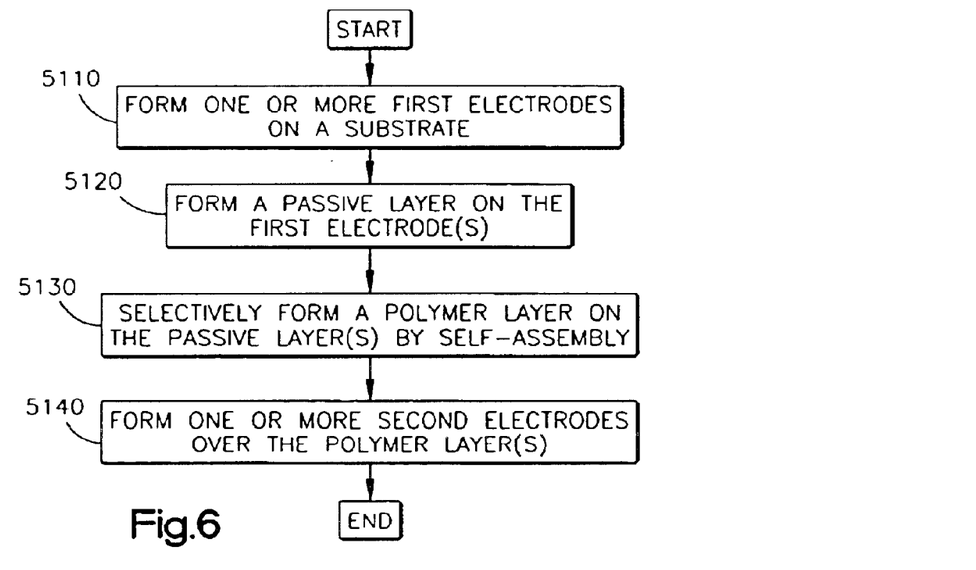
FIG. 6 is a flow chart of steps in a method for forming a memory cell in which an active layer is formed by self-assembly of a polymer.

In another aspect of the invention, an organic polymer may be self-assembled to form an active layer in a memory cell. FIG. 6 shows a set of steps in a method for forming one or more memory cells in a memory. In step S110, one or more first electrodes are formed on a substrate. For example, one or more layers of copper or other suitable material may be deposited on an insulating substrate by conventional thin film deposition techniques such as thermal evaporation, sputtering, e-beam evaporation, etc. The copper or other material may be deposited in any suitable arrangement, such as individual pads, strips or other shapes, to any suitable thickness, such as 100 to 400 Angstroms.

In step S120, a passive layer is formed over the first electrode(s). The passive layer(s) may be made of any suitable material, such as those listed above, and may be formed in any suitable way. For example, the passive layer(s) may be formed by CVD, spin coating, thermal evaporation, etc. The passive layer(s) may also be made by exposing the electrode(s) to a material to form a passive layer on the electrode(s). For example, copper electrode(s) may be exposed to a hydrogen sulfide ($H_2S$) gas in a chamber at room temperature for approximately 10–15 minutes to form a layer of copper sulfide ($CU_{2-x}S$).

In step S130, a polymer layer may be formed over the passive layer by self-assembly. For example, the memory cell may be placed in a chamber in which a monomer gas or liquid is provided. The memory cell may be exposed to the monomer gas or liquid at a suitable temperature (or other suitable temperature) for a suitable period of time. For example, passive layer may be exposed to a gas including a monomer of phenylacetylene (or an admixture of monomers of phenylacetylene and diphenylacetylene) at 125 degrees Celsius for approximately 3 hours. During the exposure, the monomer components may self-assemble on the passive layer to form a layer of organic polymer. That is, the monomer components may join together on the passive layer to form a layer of polymer suitable for the active layer. In some embodiments, the passive layer(s) may be surrounded by a dielectric, insulating or other suitable material so that the layer of organic polymer self-assembles only on the passive layer and not on portions around the passive layer. Thus, the passive layer may provide an adhesion layer for the monomer so that the monomer only self-assembles on the passive layer, and not the portions around the passive layer, e.g., dielectric or insulating portions between memory cells.

In step S140, one or more second electrodes are formed over the active layer(s) to form one or more memory cells. As with the electrode(s) formed in step S110, the electrodes formed over the active layer may be formed using any suitable process and using any suitable material.

The above-described illustrative, but non-limitative examples of memory devices or cells fabricated according to the inventive concept and methodology reflect the extreme flexibility and versatility with regard to device structures and materials selection afforded by the present invention. Inasmuch as the read, write, and erase characteristics of the inventive devices are readily amenable to variation by means of appropriate selection of materials and layer thicknesses, the inventive devices are well suited for use in a variety of applications currently employing conventional semiconductor-based memory devices. Moreover, the inventive memory devices are readily fabricated in cost-effective manner utilizing conventional manufacturing-technologies.

The controller 101 in the embodiments above may include any suitable general purpose data processing system, which can be, or include a suitably programmed, general purpose computer or network of general purpose computers and other associated devices such as communication devices and/or other circuitry or components necessary to perform the desired input/output or other functions. The controller 101 can be implemented, at least in part, as single special purpose integrated circuits, e.g., ASICs or an array of ASICs, each having a main or central processor section for overall, system-level control and separate sections dedicated to performing various different specific computations, functions and other processes under the control of the central processor section. The controller 101 can also be implemented using a plurality of separate dedicated programmable integrated or other electronic circuits or devices, e.g., hard wired electronic or logic circuits, such as discrete element circuits or programmable logic devices. The controller 101 also can include other devices, such as information display devices (monitors, printers, display lights, etc.), user input devices (a keyboard, user pointing device, touch screen or other user interface), data storage devices, communication devices, airflow sensors, or other electronic circuitry or components.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A reversibly programmable memory comprising at least one memory cell, the at least one memory cell comprising:
   a first conductive electrode layer;
   a passive layer formed over the first conductive electrode layer, the passive layer comprising a super-ionic material comprising copper sulfide adapted to reversibly donate and accept charged species, the charged species comprising ions or ions and electrons;
   an active layer formed over the passive layer, the active layer comprising an organic polymer that has a reversibly variable electrical conductivity upon the introduction and removal of charged species from the passive layer, the electrical conductivity of the organic polymer being variable between three or more states to store multiple information bits, the organic polymer having a relatively lower electrical conductivity when free of charged species and a relatively higher conductivity when charged species are introduced; and
   a second conductive electrode layer formed over the active layer;
   wherein the passive layer reversibly donates and accepts charged species to and from the active layer when an electrical potential difference is applied between the two conductive electrode layers, and the two conductive electrode layers are used to both program the memory cell to store information and read stored information from the memory cell.

2. The memory of claim 1, wherein the first conductive electrode layer comprises copper.

3. The memory of claim 1, wherein the active layer comprises one of polyphenylacetylene and polydiphenylacetylene.

4. The memory of claim 1, wherein:
   the first conductive electrode layer comprises copper, and
   the active layer comprises one of polyphenylacetylene and polydiphenylacetylene.

5. The memory of claim 1, further comprising:
   a barrier layer comprising a material that impedes spontaneous movement of charged species between the active layer and the passive layer when an electrical potential difference is not applied between the two conductive electrode layers.

6. The memory of claim 5, wherein the barrier layer is positioned between the active layer and the passive layer.

7. The memory of claim 1, wherein the active layer has a thickness from about 50 to about 1000 Angstroms.

8. The memory of claim 1, wherein the passive layer has a thickness from about 20 to about 100 Angstroms.

9. The memory of claim 1, wherein the memory cell comprises only one active layer and only one passive layer between the first and second conductive electrode layers.

10. A reversibly programmable memory comprising at least one memory cell, the at least one memory cell comprising:
    a first conductive electrode layer;
    a passive layer formed over the first conductive electrode layer, the passive layer comprising a superionic material adapted to reversibly donate and accept charged species, the charged species comprising ions or ions and electrons;
    an active layer formed over the passive layer, the active layer comprising an organic polymer that has a reversibly variable electrical conductivity upon the introduction and removal of charged species from the passive layer, the electrical conductivity of the organic polymer being variable between three or more states to store multiple information bits, the organic polymer having a relatively lower electrical conductivity when free of charged species and a relatively higher electrical conductivity when charged species are introduced; and
    a second conductive electrode layer formed over the active layer;
    wherein the passive layer reversibly donates and accepts charged species to and from the active layer when an electrical potential difference is applied between the two conductive electrode layers, and the two conductive electrode layers are used to both program the memory cell to store information and read stored information from the memory cell.

11. The memory of claim 10, wherein the passive layer comprises copper sulfide.

12. The memory of claim 10, wherein the first conductive electrode layer comprises copper.

13. The memory of claim 10, wherein the active layer comprises one of polyphenylacetylene and polydiphenylacetylene.

14. The memory of claim 10, wherein:
    the first conductive electrode layer comprises copper,
    the passive layer comprises copper sulfide, and
    the active layer comprises one of polyphenylacetylene and polydiphenylacetylene.

15. The memory of claim 10, further comprising:

a barrier layer comprising a material that impedes spontaneous movement of charged species between the active layer and the passive layer when an electrical potential difference is not applied between the two conductive electrode layers.

16. The memory of claim 15, wherein the barrier layer is positioned between the active layer and the passive layer.

17. The memory of claim 10, wherein the active layer has a thickness from about 50 to about 1000 Angstroms.

18. The memory of claim 10, wherein the passive layer has a thickness from about 20 to about 100 Angstroms.

19. The memory of claim 10, wherein the memory cell comprises only one active layer and only one passive layer between the first and second conductive electrode layers.

20. The memory of claim 10, wherein the active layer comprises one of polyaniline, polythiophene, polypyrrole, polystyrene, polyfuran, and polyindole.

* * * * *